United States Patent
Kuga

(10) Patent No.: US 10,468,314 B2
(45) Date of Patent: Nov. 5, 2019

(54) SEMICONDUCTOR POWER MODULE AND POWER CONVERSION APPARATUS

(71) Applicant: Mitsubishi Electric Corporation, Tokyo (JP)

(72) Inventor: Shoichi Kuga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 5 days.

(21) Appl. No.: 15/790,088

(22) Filed: Oct. 23, 2017

(65) Prior Publication Data

US 2018/0254228 A1  Sep. 6, 2018

(30) Foreign Application Priority Data

Mar. 2, 2017 (JP) ................. 2017-039396

(51) Int. Cl.

| | |
|---|---|
| *H01L 23/08* | (2006.01) |
| *H01L 21/48* | (2006.01) |
| *H01L 23/057* | (2006.01) |
| *H01L 23/13* | (2006.01) |
| *H01L 23/00* | (2006.01) |
| *H02M 7/00* | (2006.01) |
| *H01L 23/24* | (2006.01) |
| *H01L 23/31* | (2006.01) |
| *H01L 23/498* | (2006.01) |
| *H02P 27/08* | (2006.01) |

(52) U.S. Cl.
CPC ............ *H01L 23/08* (2013.01); *H01L 21/481* (2013.01); *H01L 23/057* (2013.01); *H01L 23/13* (2013.01); *H01L 23/24* (2013.01); *H01L 23/3135* (2013.01); *H01L 23/49827* (2013.01); *H01L 24/48* (2013.01); *H02M 7/003* (2013.01); *H01L 2224/48137* (2013.01); *H02P 27/08* (2013.01)

(58) Field of Classification Search
CPC ........ H01L 23/08; H01L 23/057; H01L 23/13
See application file for complete search history.

(56) References Cited

U.S. PATENT DOCUMENTS

| | | | | |
|---|---|---|---|---|
| 8,227,822 B2* | 7/2012 | Hung | .................... | H01L 33/507 257/100 |
| 2008/0265395 A1* | 10/2008 | Hasegawa | ............. | H01L 23/043 257/690 |
| 2011/0006318 A1* | 1/2011 | Chung | ..................... | F21K 9/00 257/91 |
| 2014/0036461 A1* | 2/2014 | Palaniswamy | ........ | H01L 33/486 361/762 |
| 2016/0218050 A1* | 7/2016 | Yoshihara | ............... | H01L 24/49 |

FOREIGN PATENT DOCUMENTS

| | | |
|---|---|---|
| JP | H09-055577 A | 2/1997 |
| JP | 2001-057409 A | 2/2001 |
| JP | 2006-032617 A | 2/2006 |
| JP | 2013-161951 A | 8/2013 |

* cited by examiner

*Primary Examiner* — Kyoung Lee
*Assistant Examiner* — Christina A Sylvia
(74) *Attorney, Agent, or Firm* — Studebaker & Brackett PC

(57) ABSTRACT

A semiconductor power module includes: an insulating substrate including a concave portion provided on a top surface of the insulating substrate; a substrate electrode embedded in the concave portion; a semiconductor device bonded onto the substrate electrode; and an insulating resin covering a top end part of the substrate electrode.

4 Claims, 8 Drawing Sheets 1  3 4  2

1  6 3 4  2

SEMICONDUCTOR POWER MODULE AND POWER CONVERSION APPARATUS

BACKGROUND OF THE INVENTION

Field

The present invention relates to a semiconductor power module and a power conversion apparatus.

Background

Semiconductor power modules are required to exhibit high reliability to be able to consecutively turn on/off a current at a high voltage for a long period of time. In order to improve reliability with respect to a withstand voltage, substrate electrodes are covered with insulating resin and current leakage is thereby suppressed. For example, a thin film of polyimide-based or polyamide-imide-based insulating resin is applied to the surfaces of the substrate electrodes on a ceramic insulating substrate and hardened to thereby improve reliability with respect to a withstand voltage (e.g., see JP 2006-32617 A).

SUMMARY

Insulating resin having a thickness of 5 μm to 100 μm is applied using a potting method. However, a top end part of the substrate electrode is not covered with the insulating resin due to surface tension of resin after the application of the insulating resin or volume contraction when the resin is caused to harden. As a result, current leakage occurs between the substrate electrodes, abnormal discharge takes place at the top end part of the substrate electrode, causing a problem that the substrate electrode is destroyed.

The present invention has been implemented to solve the above-described problem, and it is an object of the present invention to provide a semiconductor power module and a power conversion apparatus capable of improving reliability with respect to a withstand voltage.

According to the present invention, a semiconductor power module includes: an insulating substrate including a concave portion provided on a top surface of the insulating substrate; a substrate electrode embedded in the concave portion; a semiconductor device bonded onto the substrate electrode; and an insulating resin covering a top end part of the substrate electrode.

In the present invention, the substrate electrode is embedded in the concave portion of the insulating substrate. This avoids any level difference between the insulating substrate and the substrate electrode, and makes it possible to uniformly form the insulating resin on the surface of the substrate electrode and securely cover the top end part of the substrate electrode with the insulating resin. It is therefore possible to improve reliability with respect to a withstand voltage.

Other and further objects, features and advantages of the invention will appear more fully from the following description.

DESCRIPTION OF EMBODIMENTS

A semiconductor power module and a power conversion apparatus according to the embodiments of the present invention will be described with reference to the drawings. The same components will be denoted by the same symbols, and the repeated description thereof may be omitted.

First Embodiment

Figure 1:
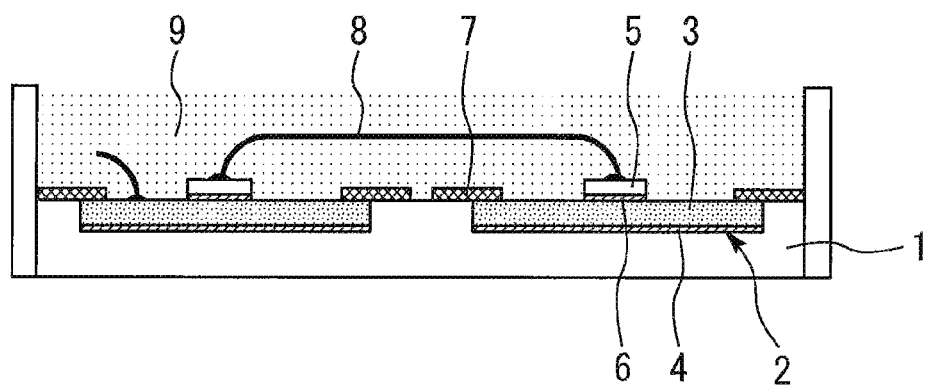
FIG. 1 is a cross-sectional view illustrating a semiconductor power module according to a first embodiment of the present invention.
Figure 2:
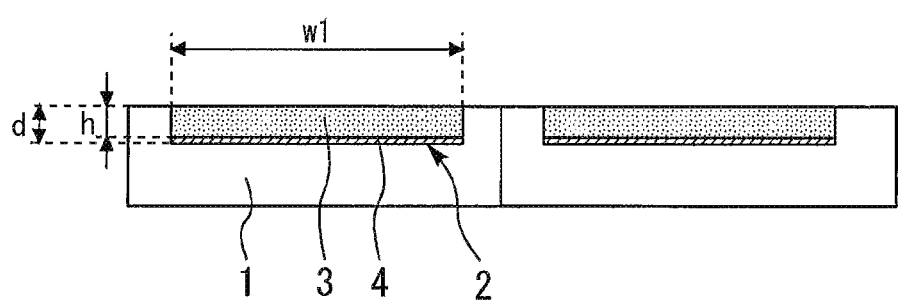
FIG. 2 is an enlarged cross-sectional view of the insulating substrate and the substrate electrode according to the first embodiment of the present invention.

FIG. 1 is a cross-sectional view illustrating a semiconductor power module according to a first embodiment of the present invention. A concave portion 2 is formed on a top surface of an insulating substrate 1 of ceramic or the like. A substrate electrode 3 is embedded in the concave portion 2 via solder 4. FIG. 2 is an enlarged cross-sectional view of the insulating substrate and the substrate electrode according to the first embodiment of the present invention. The substrate electrode 3 has a thickness h of 200 μm to 800 μm, which is equal to or less than a depth d of the concave portion 2.

A semiconductor device 5 is bonded onto the substrate electrode 3 via solder 6. A polyimide-based or polyamide-imide-based insulating resin 7 having a thickness of 5 μm to 100 μm covers the top end part of the substrate electrode 3. A wire-interconnect 8 for applying a voltage is connected to the top surface of the semiconductor device 5. Silicone gel 9 covers the substrate electrode 3 and the semiconductor device 5.

Figure 3:
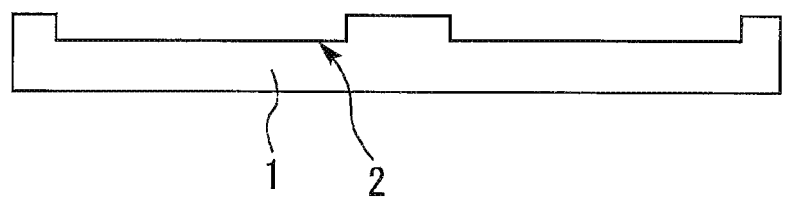
FIGS. 3 to 7 are cross-sectional views illustrating the method of manufacturing the semiconductor power module according to the first embodiment of the present invention.
Figure 4:
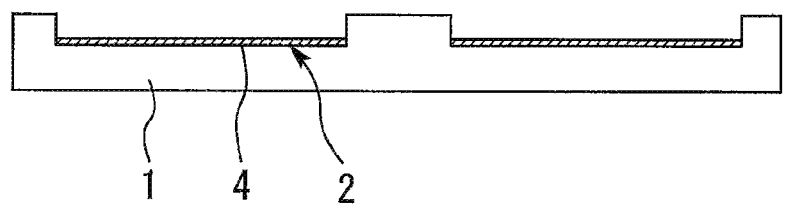

Next, a method of manufacturing the semiconductor power module according to the present embodiment will be described. FIGS. 3 to 7 are cross-sectional views illustrating the method of manufacturing the semiconductor power module according to the first embodiment of the present invention. First, as shown in FIG. 3, the concave portion 2 is formed on the top surface of the insulating substrate 1. Next, as shown in FIG. 4, solder 4 is formed on a bottom surface of the concave portion 2.

Figure 5:
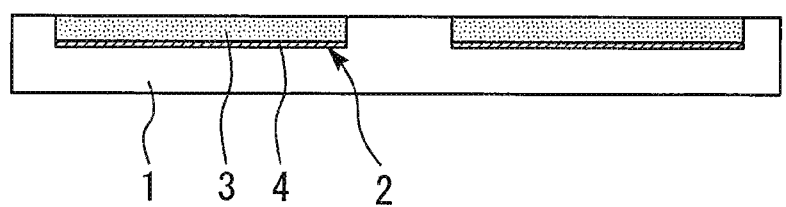

Next, as shown in FIG. 5, a conductive metal such as an aluminum foil plate, copper foil plate or a metal paste thereof is bonded to the concave portion 2 at high temperature using the solder 4 to form the substrate electrode 3. Note that a brazing material may be used instead of the solder 4 or the substrate electrode 3 may be formed using sputtering.

Figure 6:
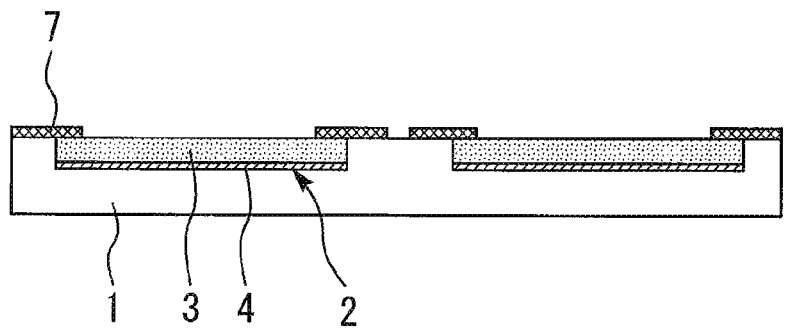
Figure 7:
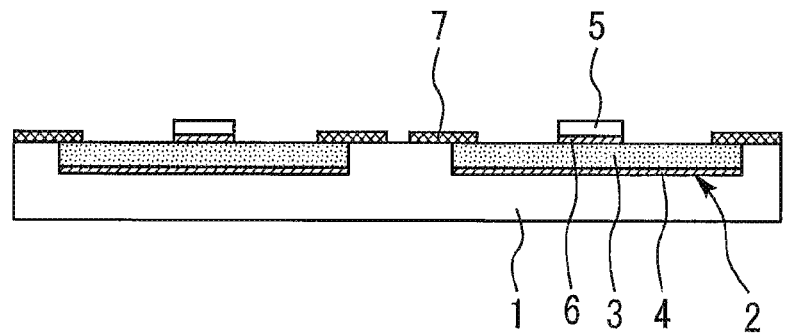

Next, as shown in FIG. 6, the insulating resin 7 is thinly applied so as to cover the top end part of the substrate electrode 3 using a potting method and is caused to harden. Next, as shown in FIG. 7, the semiconductor device 5 is bonded onto the top surface of the substrate electrode 3 via the solder 6. Next, wire connection or the like is made to the semiconductor device 5.

Figure 8:
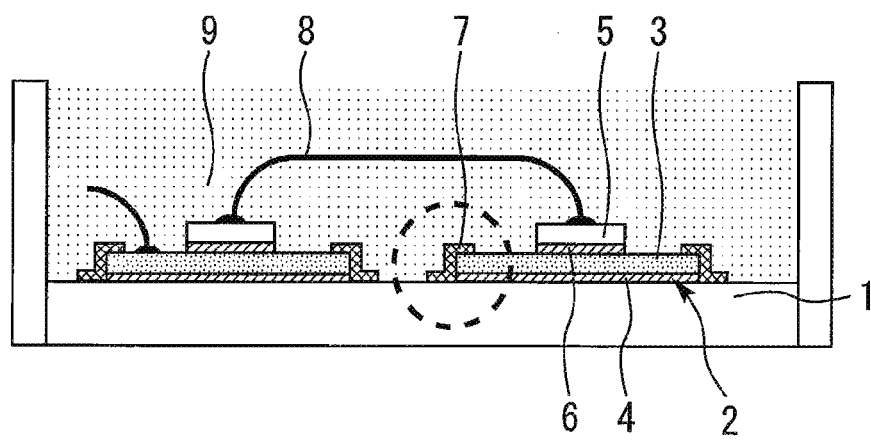
FIG. 8 is a cross-sectional view illustrating a semiconductor power module according to a comparative example.
Figure 9:
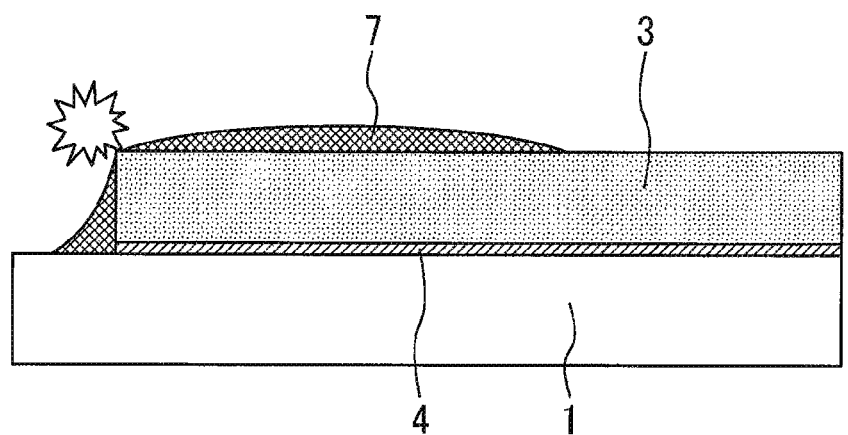
FIG. 9 is an enlarged cross-sectional view of a portion enclosed by a broken line in FIG. 8.

Next, effects of the present embodiment will be described in comparison with a comparative example. FIG. 8 is a cross-sectional view illustrating a semiconductor power module according to a comparative example. FIG. 9 is an enlarged cross-sectional view of a portion enclosed by a broken line in FIG. 8. In the comparative example, no concave portion 2 is formed on the top surface of the insulating substrate 1 and the substrate electrode 3 is formed on a flat top surface. Therefore, there is a large level difference between the insulating substrate 1 and the substrate electrode 3. The top end part of the substrate electrode 3 is not covered with the insulating resin 7 due to surface tension of the insulating resin 7 after the application thereof or volume contraction when the insulating resin 7 is caused to harden. Thus, current leakage occurs between the substrate electrodes 3, which may cause abnormal discharge at the top end part of the substrate electrode 3, causing the substrate electrode 3 to be destroyed.

In contrast, in the present embodiment, the substrate electrode 3 is embedded in the concave portion 2 of the insulating substrate 1 and the height of the top surface of the substrate electrode 3 is equal to or less than the height of the top surface of the insulating substrate 1. This avoids any level difference between the insulating substrate 1 and the substrate electrode 3, and makes it possible to uniformly form the insulating resin 7 on the surface of the substrate electrode 3 and securely cover the top end part of the substrate electrode 3 with the insulating resin 7. Therefore, no current leakage occurs between the substrate electrodes 3 and no abnormal discharge occurs at the top end part of the substrate electrode 3, and it is therefore possible to improve reliability with respect to a withstand voltage. Furthermore, improved reliability allows a design such that the distance between the substrate electrodes 3 is made shorter, enabling the size of the module to be smaller. A smaller module improves cooling performance of the module, reduces power loss and improves the performance.

Second Embodiment

Figure 10:
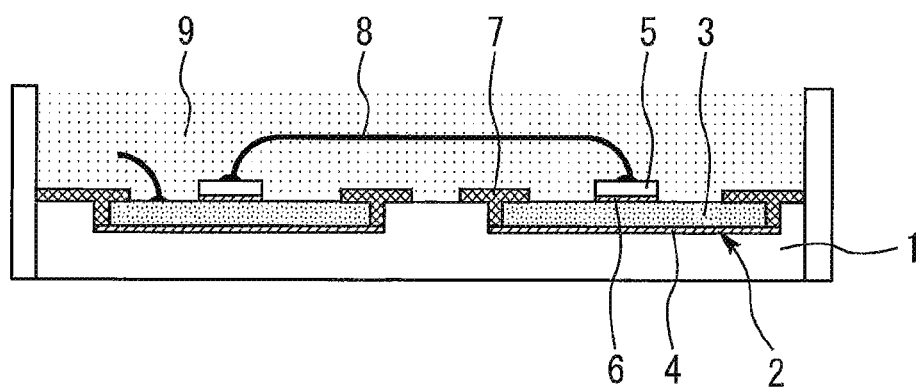
FIG. 10 is a cross-sectional view illustrating a semiconductor power module according to a second embodiment of the present invention.
Figure 11:
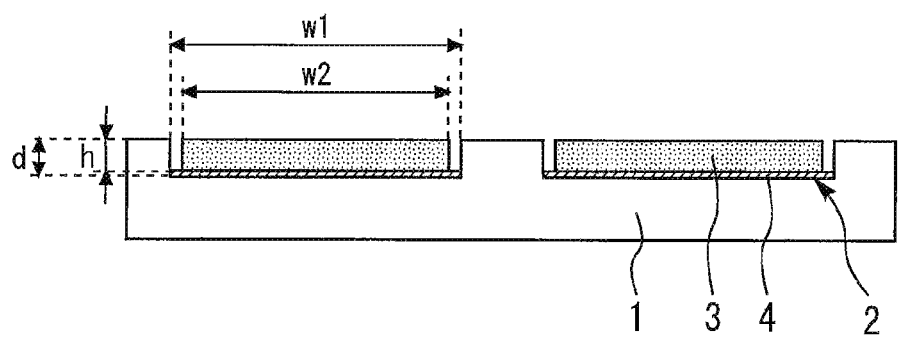
FIG. 11 is an enlarged cross-sectional view of an insulating substrate and a substrate electrode according to the second embodiment of the present invention.

FIG. 10 is a cross-sectional view illustrating a semiconductor power module according to a second embodiment of the present invention. FIG. 11 is an enlarged cross-sectional view of an insulating substrate and a substrate electrode according to the second embodiment of the present invention. Unlike the first embodiment, a width w2 of the substrate electrode 3 is smaller than a width w1 of the concave portion 2. The insulating resin 7 covers the top end part and the side face as well of the substrate electrode 3. A thickness of the insulating resin 7 is smaller than (w1−w2)/2. The rest of the configuration is similar to that of the first embodiment.

Figure 12:
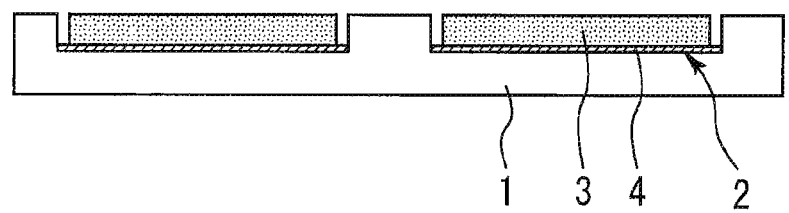
FIGS. 12 to 14 are cross-sectional views illustrating the method of manufacturing the semiconductor power module according to the second embodiment of the present invention.
Figure 13:
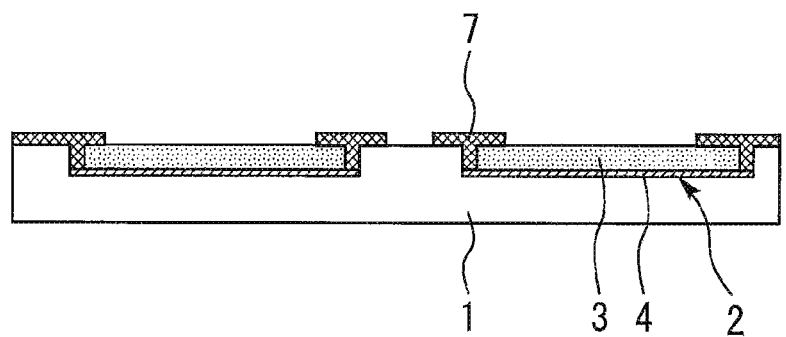
Figure 14:
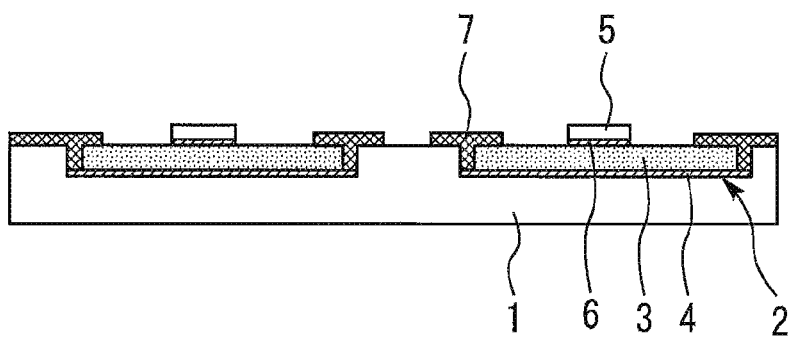

Next, a method of manufacturing the semiconductor power module according to the present embodiment will be described. FIGS. 12 to 14 are cross-sectional views illustrating the method of manufacturing the semiconductor power module according to the second embodiment of the present invention. First, steps in FIG. 3 and FIG. 4 will be executed as in the case of the first embodiment. Next, as shown in FIG. 12, the substrate electrode 3 which has a smaller width than the concave portion 2 is formed in the concave portion 2. Next, as shown in FIG. 13, the insulating resin 7 is thinly applied using a potting method so as to cover the top end part and the side face of the substrate electrode 3 and is caused to harden. Next, as shown in FIG. 14, the semiconductor device 5 is bonded onto the top surface of the substrate electrode 3 via the solder 6. The rest of steps are similar to those of the first embodiment.

In the present embodiment, the insulating resin 7 covers not only the top end part but also the side face of the substrate electrode 3. This makes it possible to suppress leakage current in the lateral direction with respect to the side face of the substrate electrode 3, increase the withstand voltage in the lateral direction, and it is therefore possible to further improve reliability of the device.

Note that the semiconductor device 5 is not limited to one formed of silicon, but may also be formed of a wide band gap semiconductor having a larger band gap than silicon. Examples of the wide band gap semiconductor include silicon carbide, nitride gallium-based material or diamond. The semiconductor device formed of such a wide band gap semiconductor has a high withstand voltage and a high maximum allowable current density, and can thereby be made smaller. Use of such a small semiconductor device allows a semiconductor power module incorporating this semiconductor device also to be downsized and highly integrated. Furthermore, since the semiconductor device is highly heat-resistant, it is possible to reduce the size of radiator fins of a heat sink and introduce an air cooling system instead of a water cooling system, and it is thereby possible to further reduce the size of the semiconductor power module. Moreover, the semiconductor device has less power loss and exhibits high efficiency, and can thereby provide a highly efficient semiconductor power module.

Third Embodiment

In this embodiment, the semiconductor power module according to the first or second embodiment described above are applied to an electric power conversion device. The electric power conversion device is, for example, an inverter device, a converter device, a servo amplifier, or a power supply unit. Although the present invention is not limited to a specific electric power conversion device, a case where the present invention is applied to a three-phase inverter will be described below.

Figure 15:
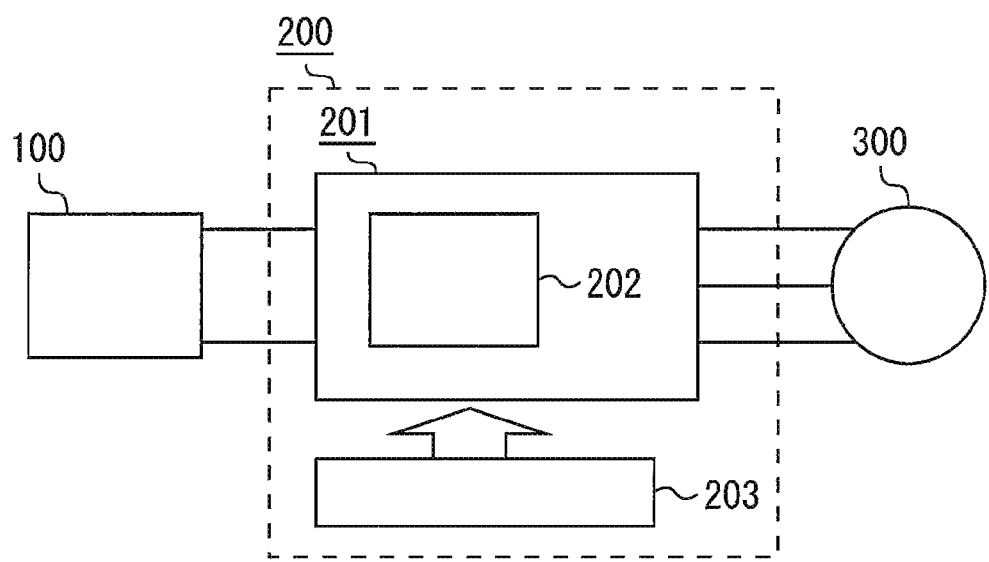
FIG. 15 is a block diagram illustrating a configuration of an electric power conversion system to which the electric power conversion device according to the third embodiment of the present invention is applied.

FIG. 15 is a block diagram illustrating a configuration of an electric power conversion system to which the electric power conversion device according to the third embodiment of the present invention is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor power module 202 corresponding to the first or second embodiment described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor power module 202. Another drive circuit different from the semiconductor power module 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

The power conversion apparatus according to the present embodiment applies the switching element of the main conversion circuit 201 and the semiconductor power module according to the first or second embodiment as a reflux diode, and can thereby improve reliability with respect to the withstand voltage.

While this embodiment illustrates an example in which the present invention is applied to a two-level three-phase inverter, the present invention is not limited to this and can be applied to various electric power conversion devices. While this embodiment illustrates a two-level electric power conversion device, the present invention can also be applied to a three-level or multi-level electric power conversion device. When power is supplied to a single-phase load, the present invention may be applied to a single-phase inverter. The present invention can also be applied to a DC/DC converter or an AC/DC converter when power is supplied to a DC load or the like.

Further, in the electric power conversion device to which the present invention is applied, the above-mentioned load is not limited to an electric motor. For example, the load may also be used as a power supply device for an electric discharge machine, a laser beam machine, an induction heating cooker, or a non-contact device power feeding system. More alternatively, the load may be used as a power conditioner for a photovoltaic power generating system, an electricity storage system, or the like.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-039396, filed on Mar. 2, 2017 including specification, claims, drawings and summary, on which the Convention priority of the present application is based, is incorporated herein by reference in its entirety.

The invention claimed is:

1. A semiconductor power module comprising:
    an insulating substrate including a concave portion provided on a top surface of the insulating substrate;
    a substrate electrode embedded in the concave portion;
    a semiconductor device bonded onto the substrate electrode; and
    an insulating resin covering a top end part of the substrate electrode, wherein
    the substrate electrode is formed in the concave portion so that an entire top surface of the substrate electrode is exposed from the insulating substrate, and
    the insulating resin covers a peripheral region of the substrate electrode and a region of the top surface adjacent to the concave portion but not a region of the substrate electrode interior of the peripheral region.

2. The semiconductor power module according to claim 1, wherein a height of a top surface of the substrate electrode is equal to or less than a height of the top surface of the insulating substrate.

3. The semiconductor power module according to claim 1, wherein a width of the substrate electrode is smaller than a width of the concave portion, and
    the insulating resin covers a side face of the substrate electrode.

4. A power conversion apparatus comprising:
a main conversion circuit including the semiconductor power module according to claim 1, converting input power and outputting the converted power; and
a control circuit outputting a control signal for controlling the main conversion circuit to the main conversion circuit.

\* \* \* \* \*